United States Patent
Hamou et al.

(10) Patent No.: US 8,201,311 B1
(45) Date of Patent: Jun. 19, 2012

(54) PROCESS OF MAKING A BAW RESONATOR BI-LAYER TOP ELECTRODE

(75) Inventors: Haim Ben Hamou, Portland, OR (US); Ralph N. Wall, Beaverton, OR (US); Guillaume Bouche, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 456 days.

(21) Appl. No.: 12/221,907

(22) Filed: Aug. 6, 2008

Related U.S. Application Data

(62) Division of application No. 12/080,348, filed on Apr. 1, 2008, now Pat. No. 7,737,612, and a division of application No. 11/442,375, filed on May 25, 2006, now Pat. No. 7,600,303.

(51) Int. Cl.
*H04R 17/10* (2006.01)
*H04R 31/00* (2006.01)

(52) U.S. Cl. .............. 29/25.35; 29/594; 29/847; 438/3; 333/219

(58) Field of Classification Search ............... 29/25.35, 29/594, 846, 842, 847; 438/3, 240, 243, 438/253; 310/363–365; 216/13; 333/219
See application file for complete search history.

(56) References Cited

U.S. PATENT DOCUMENTS

| | | | |
|---|---|---|---|
| 4,692,653 A | 9/1987 | Kushida et al. | 310/334 |
| 5,589,810 A | 12/1996 | Fung | 338/4 |
| 5,692,279 A | 12/1997 | Mang et al. | 29/25.35 |
| 5,844,347 A | 12/1998 | Takayama et al. | 310/313 R |
| 6,089,701 A | 7/2000 | Hashizume et al. | |
| 6,103,566 A * | 8/2000 | Tamaru et al. | 438/240 |
| 6,291,931 B1 | 9/2001 | Lakin | 310/364 |
| 6,307,447 B1 | 10/2001 | Barber et al. | 333/189 |
| 6,407,649 B1 | 6/2002 | Tikka et al. | 333/133 |
| 6,500,678 B1 | 12/2002 | Aggarwal et al. | 438/3 |
| 6,596,547 B2 * | 7/2003 | Aggarwal et al. | 438/3 |
| 6,675,450 B1 * | 1/2004 | Fetter et al. | 29/25.35 |
| 6,937,114 B2 | 8/2005 | Furukawa et al. | 333/154 |
| 7,042,136 B2 | 5/2006 | Kita et al. | 310/320 |
| 7,148,610 B2 | 12/2006 | Jacot et al. | 310/364 |
| 7,220,600 B2 | 5/2007 | Summerfelt et al. | 438/3 |

(Continued)

FOREIGN PATENT DOCUMENTS

JP 53068190 A * 6/1978 ............... 29/25.35 X (Continued)

OTHER PUBLICATIONS

Notice of Allowance dated Feb. 22, 2010, U.S. Appl. No. 12/080,348, filed Apr. 1, 2008, Haim Ben Hamou et al.

(Continued)

*Primary Examiner* — A. Dexter Tugbang
(74) *Attorney, Agent, or Firm* — Blakely Sokoloff Taylor & Zafman LLP

(57) ABSTRACT

A piezoelectric layer is coupled to a bottom electrode in a method of fabricating a piezoelectric resonator. A bottom metal layer of a top electrode is deposited on the piezoelectric layer. The bottom metal layer is patterned and etched. A top metal layer of the top electrode is deposited on the etched bottom metal layer. The top metal layer is patterned and etched. An interconnect metal layer is deposited on the etched top metal layer and the piezoelectric layer such that the interconnect metal layer isolates the bottom metal layer from subsequent etch steps.

14 Claims, 3 Drawing Sheets

U.S. PATENT DOCUMENTS

| | | |
|---|---|---|
| 7,276,836 B2 | 10/2007 | Umeda et al. .......... 310/320 |
| 7,323,805 B2 | 1/2008 | Sano et al. |
| 7,358,831 B2 | 4/2008 | Larson, III et al. |
| 7,436,102 B2 | 10/2008 | Fujii et al. |
| 7,463,117 B2 | 12/2008 | Ohara et al. |
| 7,466,537 B2 | 12/2008 | Nakayama .......... 361/311 |
| 7,482,737 B2 | 1/2009 | Yamada et al. |
| 2004/0115881 A1 | 6/2004 | Choi et al. .......... 438/240 |
| 2006/0131990 A1 | 6/2006 | Milsom et al. .......... 310/311 |
| 2006/0255693 A1 | 11/2006 | Nishihara et al. |
| 2007/0152540 A1 | 7/2007 | Fujii et al. .......... 310/324 |
| 2008/0055369 A1 | 3/2008 | Saito |
| 2008/0157632 A1 | 7/2008 | Williams .......... 310/364 |

FOREIGN PATENT DOCUMENTS

| | | |
|---|---|---|
| JP | 2004-135163 A | 4/2004 |

OTHER PUBLICATIONS

Tapani Kakkonen, Tuomas Pensala, Juha Vartiainen, Houni V. Knuuttila, Jyrki Kaitila, Martti M. Salomaa, "*Estimating Materials Parameters in Thin-Film BAW Resonators Using Measured Dispersion Curves,*" Jan. 2004, pp. 42-51, IEEE, vol. 51, No. 1.

Non-Final Office Action dated Sep. 23, 2009, U.S. Appl. No. 12/080,348, filed Apr. 1, 2008, Haim Ben Hamou.

Non-Final Office Action dated Dec. 2, 2008, U.S. Appl. No. 11/422,375, filed May 25, 2006.

Notice of Allowance dated Jun. 15, 2009, U.S. Appl. No. 11/422,375, filed May 25, 2006.

R. Aigner, J. Ella, H-J. Elbrecht, W. Nessler, S. Marksteiner, "*Advancement of MEMS into RF-Filter Applications,*" 2002, pp. 1-4, IEEE.

Kenneth M. Lakin, Gerald R. Klein, Kevin T. McCarron, "*High-Q Microwave Acoustic Resonators and Filters,*" Dec. 1993, pp. 2139-2146, IEEE Transaction on Microwave Theory and Techniques, vol. 41 No. 12.

K. M. Lakin, "*Thin Film Resonators and High Frequency Filters,*" Jun. 1, 2001, pp. 1-18, TFR Technologies, Inc.

\* cited by examiner

PROCESS OF MAKING A BAW RESONATOR BI-LAYER TOP ELECTRODE

RELATED APPLICATION(S)

This Application is a divisional of U.S. patent application Ser. No. 11/442,375, filed on May 25, 2006, and entitled "A BAW Resonator Bi-Layer Top Electrode With Zero Etch Undercut," now U.S. Pat. No. 7,600,303. The co-pending U.S. patent application Ser. No. 11/442,375, filed on May 25, 2006, and entitled "A BAW Resonator Bi-Layer Top Electrode With Zero Etch Undercut," and the co-pending U.S. patent application Ser. No. 12/080,348, filed on Apr. 1, 2008, and entitled "A BAW Resonator Bi-Layer Top Electrode With Zero Etch Undercut," are both hereby incorporated by reference.

FIELD OF THE INVENTION

The present invention relates to the field of piezoelectric resonators. More particularly, the present invention relates to the field of a bulk acoustic wave (BAW) resonator with a bi-layer top electrode with zero etch undercut.

BACKGROUND OF THE INVENTION

Piezoelectric resonators are primarily used in RF filters and oscillators. RF filters are increasingly being used in mobile communications devices. These resonators are commonly referred to as bulk acoustic wave (BAW) resonators. Other acronyms for the same or similar devices include FBAR (thin-film bulk acoustic resonators), SMR (solidly mounted resonators), TFR (thin film resonators), or SCR (stacked crystal resonators). The resonators are interconnected, typically at the upper metal level, to build RF filters.

It is known that a bulk acoustic wave (BAW) resonator in general comprises a piezoelectric layer sandwiched between two electronically conductive layers that serve as electrodes. When a radio frequency (RF) signal is applied across the device, it produces a mechanical wave in the piezoelectric layer. BAW resonators are typically fabricated on silicon (Si), gallium arsenide (GaAs), glass, or ceramic substrates. BAW resonators are typically manufactured using various thin film manufacturing techniques, such as for example sputtering, vacuum evaporation or chemical vapor deposition. BAW resonators utilize a piezoelectric thin film layer for generating the acoustic bulk waves. The resonance frequencies of typical BAW resonators range from 0.5 GHz to 5 GHz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of an acoustically active piezoelectric layer, electrodes on opposite sides of the piezoelectric layer, and an acoustical isolation from the substrate. Although the resonant frequency of a BAW device also depends on other factors, the thickness of the piezoelectric layer is the predominant factor in determining the resonant frequency. As the thickness of the piezoelectric layer is reduced, the resonance frequency is increased.

The material used to form the electrode layers is an electrically conductive material. The acoustical isolation is produced with a substrate via-hole, a micromechanical bridge structure, or with an acoustic mirror structure. In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need much modification, as in the via-hole structure. A bridge structure can also be produced using an etch pit structure, in which case a pit is etched in the substrate or the material layer below the BAW resonator to produce the free standing bridge structure.

FIG. 1 illustrates a cross-section of a conventional piezoelectric resonator. The piezoelectric resonator includes a substrate 10, an acoustic mirror or acoustic reflector 20, a bottom electrode 30, a piezoelectric layer 40, and a top electrode 50. The top electrode can be constructed from several metallic and dielectric layers. The bottom electrode 30 can also be constructed from several metallic and dielectric layers; molybdenum is typically used. The top electrode 50 shown in FIG. 1 includes a bottom metal layer 52 of a material with high acoustic impedance, and a top metal layer 54 of a material with low impedance.

FIGS. 2-5 illustrate conventional fabrication steps of the top electrode 50. As illustrated in FIG. 2, the bottom metal layer 52 is deposited on the piezoelectric layer 40. The bottom metal layer 52 is then patterned and etched, as illustrated in FIG. 3. FIG. 4 illustrates the top metal layer 54 deposited on the etched bottom metal layer 52. The top metal layer 54 is then patterned and etched, as illustrated in FIG. 5. The bottom metal layer 52 is exposed during the etch step of top metal layer 54. As a result, a portion 56 of the bottom metal layer 52 is etched, or removed, while etching the top metal layer 54. Additionally, when an interconnect metal layer is fabricated to make contact with the top electrode 50, further undercutting of the top layer 54 can occur during an etch step of the interconnect metal layer. In either case, undercutting of the top metal layer 54 negatively impacts the performance of the piezoelectric resonator.

During fabrication of conventional piezoelectric resonators, such as the process illustrated in FIGS. 2-5, problems arise during etching of the bi-layer top electrode and during etching of the metallization layer that contacts the top electrode bi-layer stack. The difficulty is finding etches that do not preferentially attack the bottom metal layer 52, which can be molybdenum, causing undercut voiding at the device periphery. This is particularly true if wet etching is employed because of various galvanic and catalytic reactions that do occur.

SUMMARY OF THE INVENTION

Embodiments of a piezoelectric resonator include a multi-layer top electrode. The multi-layer top electrode is configured such that a top most layer protects the underlying layers from subsequent etching, thereby preventing etch undercut of the top electrode. Preventing etch undercut provides a superior piezoelectric resonator architecture because of good control of the active area in-plane dimensions. In one embodiment, the multi-layer top electrode is configured as a bi-layer, so that the upper layer of the bi-layer stack protects all sides of the underlying layer from subsequent etch process steps.

Standard IC fabrication methods are used for the basic manufacturing sequences, including depositions, photolithography, and etch processes. MEMS techniques can also be employed for packaging and resonator acoustic isolation from the substrate.

The multi-layer top electrode construction is desirable in BAW resonator design that require stringent acoustic, electrical, and process integration requirements. By using two distinct materials for the multi-layer configuration, it is possible to benefit from the unique properties of each material.

In an alternative embodiment, at least the perimeter of a multi-layer top electrode is completely covered with overlapping interconnect metal. This alternative approach has the advantage of eliminating a photo step, for example the topmost layer patterning step, but it has the disadvantage that it only protects the top electrode edges during the interconnect etch and not during the top electrode etch.

In one aspect of the present invention, a piezoelectric resonator includes a bottom electrode, a piezoelectric layer coupled to the bottom electrode, and a top electrode coupled to the piezoelectric layer, wherein the top electrode comprises a bottom metal layer and a top metal layer configured such that the top metal layer isolates the bottom metal layer from subsequent etch steps. The bottom metal layer can comprise a refractory metal. The bottom metal layer can comprise molybdenum. The bottom metal layer can also comprise ruthenium, tungsten, platinum, osmium, rhenium or iridium. The top metal layer can comprise aluminum, gold, platinum, or an aluminum alloy composition. The top metal layer can also comprise a metal alloy composition. The piezoelectric resonator can also include an interconnect metal layer coupled to the top metal layer. The interconnect metal layer is physically isolated from the bottom metal layer of the top electrode. The interconnect metal layer can comprise titanium tungsten, tungsten, or molybdenum. The interconnect metal layer can comprise a first interconnect metal layer and a second interconnect metal layer. The first interconnect metal layer can comprise titanium tungsten. The second interconnect metal layer can comprise aluminum copper or copper. The interconnect metal layer can comprise a metal material that is selectively etched relative to a material of the top metal layer of the top electrode. The piezoelectric resonator can be a bulk acoustic wave resonator. The top metal layer can completely overlap the bottom metal layer.

In another aspect of the present invention, a method of fabricating a piezoelectric resonator is described. The method includes providing a bottom electrode and a piezoelectric layer coupled to the bottom electrode, depositing a bottom metal layer of a top electrode on the piezoelectric layer, patterning and etching the bottom metal layer, depositing a top metal layer of the top electrode on the etched bottom metal layer, and patterning and etching the top metal layer such that the top metal layer completely overlaps the bottom metal layer. The method can also include depositing an interconnect metal layer on the top metal layer, and patterning and etching the interconnect metal layer such that the bottom metal layer of the top electrode is isolated from the etching. The interconnect metal layer is physically isolated from the bottom metal layer of the top electrode. The interconnect metal layer can comprise a first interconnect metal layer and a second interconnect metal layer. The first interconnect metal layer can comprise titanium tungsten. The second interconnect metal layer can comprise aluminum copper or copper. The interconnect metal layer can comprise titanium tungsten, tungsten, or molybdenum. The interconnect metal layer can comprise a metal material that is selectively etched relative to a material of the top metal layer of the top electrode. The piezoelectric resonator can be a bulk acoustic wave resonator. The top metal layer can overlap the bottom metal layer by about 0.3 um to about 3 um. The bottom metal layer can comprise a refractory metal. The bottom metal layer can comprise molybdenum. The bottom metal layer can comprise ruthenium, tungsten, platinum, osmium, rhenium or iridium. The top metal layer can comprise aluminum, gold, platinum, or an aluminum alloy composition. The top metal layer can comprise a metal alloy composition.

In yet another aspect of the present invention, a piezoelectric resonator includes a bottom electrode, a piezoelectric layer coupled to the bottom electrode, a top electrode coupled to the piezoelectric layer, wherein the top electrode comprises a bottom metal layer and a top metal layer, and an interconnect metal layer coupled to the top electrode and configured such that the metal interconnect layer isolates the bottom metal layer from a metal interconnect etch step. The interconnect metal layer can be configured to cover a perimeter of the top electrode such that the bottom metal layer is isolated. The bottom metal layer can comprise a refractory metal. The bottom metal layer can comprise molybdenum. The bottom metal layer can comprise ruthenium, tungsten, platinum, osmium, rhenium or iridium. The top metal layer comprises aluminum, gold, platinum, or an aluminum alloy composition. The top metal layer can comprise a metal alloy composition. The interconnect metal layer can be configured to be in physical contact with the top metal layer and the bottom metal layer of the top electrode. The interconnect metal layer can comprise a first interconnect metal layer and a second interconnect metal layer. The first interconnect metal layer can comprise titanium tungsten. The second interconnect metal layer can comprise aluminum copper or copper. The interconnect metal layer can comprise titanium tungsten, tungsten, or molybdenum. The interconnect metal layer can comprise a metal material that is selectively etched relative to a material of the top metal layer of the top electrode. The piezoelectric resonator can be a bulk acoustic wave resonator.

In another aspect of the present invention, another method of fabricating a piezoelectric resonator is described. The method includes providing a bottom electrode and a piezoelectric layer coupled to the bottom electrode, depositing a bottom metal layer of a top electrode on the piezoelectric layer, patterning and etching the bottom metal layer, depositing a top metal layer of the top electrode on the etched bottom metal layer, patterning and etching the top metal layer, depositing an interconnect metal layer on the etched top metal layer such that the interconnect metal layer isolates the bottom metal layer from subsequent etch steps. The method can also include patterning and etching the interconnect metal layer such that the bottom metal layer of the top electrode is isolated from the etching. The interconnect metal layer can be configured to cover a perimeter of the top electrode such that the bottom metal layer is isolated. Depositing the interconnect metal layer couples the interconnect metal layer in physical contact with the top metal layer and the bottom metal layer of the top electrode. The interconnect metal layer can comprise a first interconnect metal layer and a second interconnect metal layer. The first interconnect metal layer can comprise titanium tungsten. The second interconnect metal layer can comprise aluminum copper or copper. The interconnect metal layer can comprise titanium tungsten, tungsten, or molybdenum. The interconnect metal layer can comprise a metal material that is selectively etched relative to a material of the top metal layer of the top electrode. The piezoelectric resonator can be a bulk acoustic wave resonator. The bottom metal layer can comprise a refractory metal. The bottom metal layer can comprise molybdenum. The bottom metal layer can comprise ruthenium, tungsten, platinum, osmium, rhenium or iridium. The top metal layer can comprise aluminum, gold, platinum, or an aluminum alloy composition. The top metal layer can comprise a metal alloy composition.

BRIEF DESCRIPTION OF THE DRAWINGS

Embodiments of the piezoelectric resonator are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Figure 6:
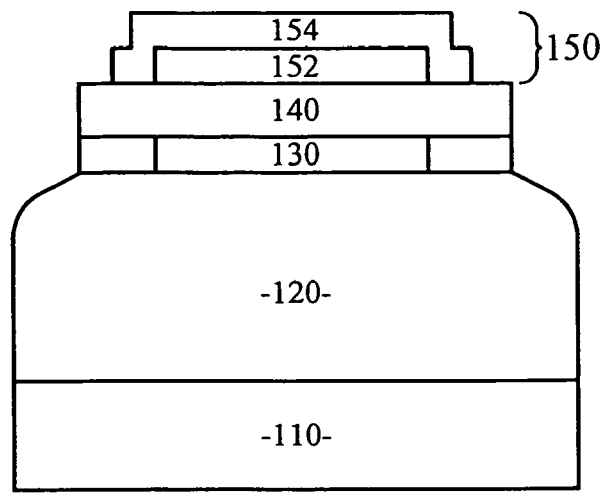
FIG. 6 illustrates a cross-section side view of a first embodiment of the piezoelectric resonator.

FIG. 6 illustrates a cross-section side view of a first embodiment of the piezoelectric resonator. The piezoelectric resonator includes an acoustic mirror or acoustic reflector 120 deposited on a substrate 110. A bottom electrode 130 is deposited on the acoustic reflector 120. A piezoelectric layer 140 is deposited on the bottom electrode 130. A top electrode 150 is deposited on the piezoelectric layer 140. In this first embodiment, the top electrode 150 is configured as a bi-layer, including a bottom metal layer 152 enclosed by a top metal layer 154. The top metal layer 154 seals the edges of the bottom metal layer 152 preventing any edge etch of the bottom metal layer 152. The bottom metal layer 152 is made of molybdenum and the top metal layer 154 is made of aluminum. Molybdenum is a preferred material for the bottom metal layer 152 because of its acoustic properties. Alternative materials for the bottom metal layer 152 include refractory metals such as ruthenium, tungsten, platinum, osmium, iridium, or rhenium. Aluminum is preferred for the top metal layer 154 because of its high electrical conductivity and for its ability to act as an etch stop during subsequent etch process steps. Alternative materials for the top metal layer 154 include an aluminum alloy, gold, platinum, or a specific alloy composition that has a high selectivity from subsequent etch steps.

Figure 7:
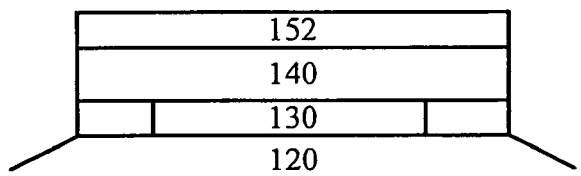
FIGS. 7-10 illustrate exemplary fabrication steps used to fabricate the top electrode of the piezoelectric resonator in FIG. 6.
Figure 8:
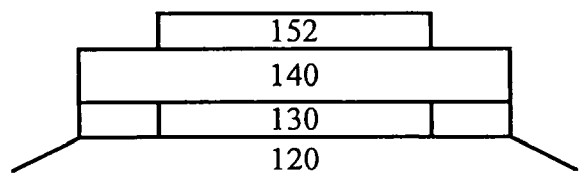
Figure 9:
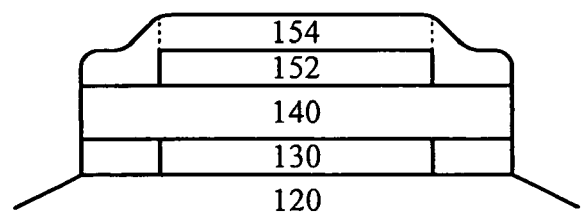

FIGS. 7-10 illustrate exemplary fabrication steps used to fabricate the top electrode of the piezoelectric resonator in FIG. 6. As illustrated in FIG. 7, the bottom metal layer 152 is deposited on the piezoelectric layer 140. The bottom metal layer 152 is then patterned and etched, as illustrated in FIG. 8. FIG. 9 illustrates the top metal layer 154 deposited on the etched bottom metal layer 152. The top metal layer 154 is then patterned and etched, as illustrated in FIG. 9. The top metal layer 154 is patterned and etched to overlap the bottom metal layer 152 on all sides. The overlap is tailored to optimize both process integration and resonator performance. In one embodiment, about 0.3 um to about 3 um of overlap is employed. The overlap prevents etch undercut of the top metal layer 152.

Figure 10:
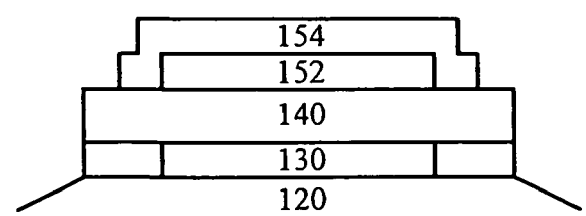
Figure 11:
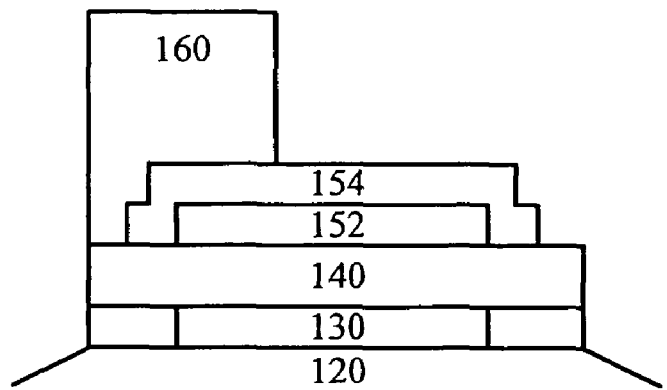
FIG. 11 illustrates an interconnect metal layer added to the piezoelectric resonator of FIG. 10.

FIG. 11 illustrates an interconnect metal layer 160 added to the piezoelectric resonator of FIG. 10. The interconnect metal layer 160 is fabricated by depositing a metal layer on the top electrode 150 and the piezoelectric layer 140, patterning, and etching the deposited metal layer. The interconnect metal layer 160 is titanium tungsten (TiW). Alternatively, the interconnect metal layer 160 is tungsten, molybdenum, or any material that is selectively etched relative to the top metal layer 154 of the top electrode 150. For example, a TiW interconnect metal layer 160 is removed selectively to an aluminum top metal layer 154 by a peroxide based wet etch. The interconnect metal layer 160 can also consist of a bi-layer, for example TiW/AlCu or TiW/Cu. In this example, the AlCu or the Cu is for low resistance interconnect, while the TiW can be etched with fine selectivity to the top electrode 150. The piezoelectric resonators shown in FIGS. 6 and 11 allow for the stacking of films to create a top electrode that prevents any etch undercut. The interconnect metal layer 160 can be used to build a filter out of a fixed number of resonators.

Figure 1:
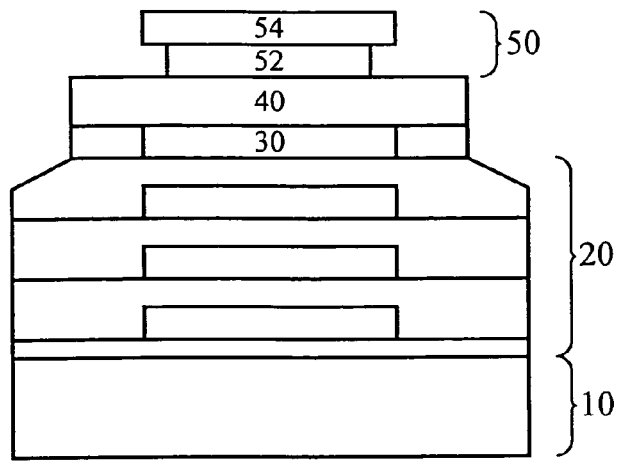
FIG. 1 illustrates a cross-section side view of a conventional piezoelectric resonator.
Figure 2:
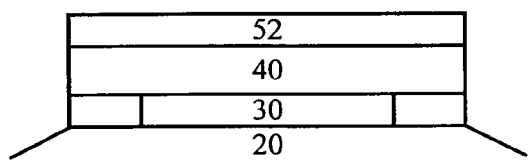
FIGS. 2-5 illustrate exemplary fabrication steps used to fabricate the top electrode of the piezoelectric resonator in FIG. 1.
Figure 3:
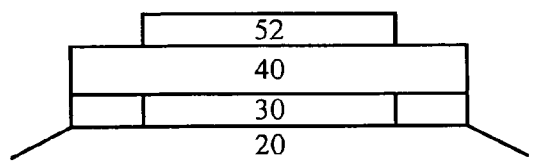
Figure 4:
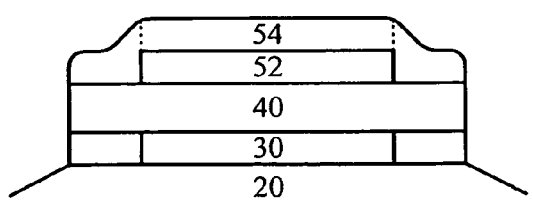
Figure 5:
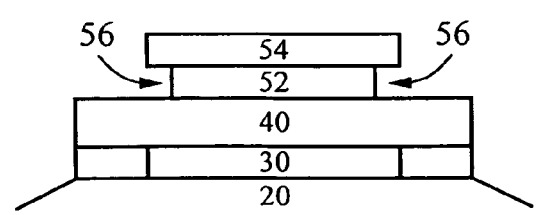
Figure 12:
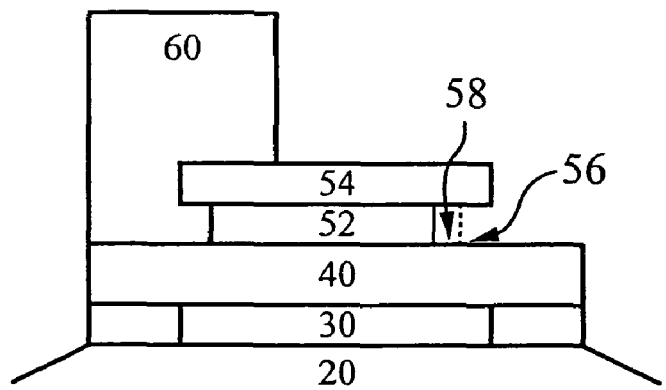
FIG. 12 illustrates the results after a subsequent etch of an interconnect metal layer on the conventional piezoelectric resonator of FIG. 5.

For comparative purposes, FIG. 12 illustrates the results after a subsequent etch of an interconnect metal layer 60 on the conventional piezoelectric resonator of FIG. 5. As is shown in FIG. 12, etching the interconnect metal layer 60 further undercuts the top metal layer 54 by removing an additional portion 58 of the exposed bottom metal layer 52. In contrast, the bottom metal layer 152 of the piezoelectric resonator in FIG. 11 is completely isolated from etching of the interconnect metal layer 160, as well as from the original etching of the top metal layer 154.

Figure 13:
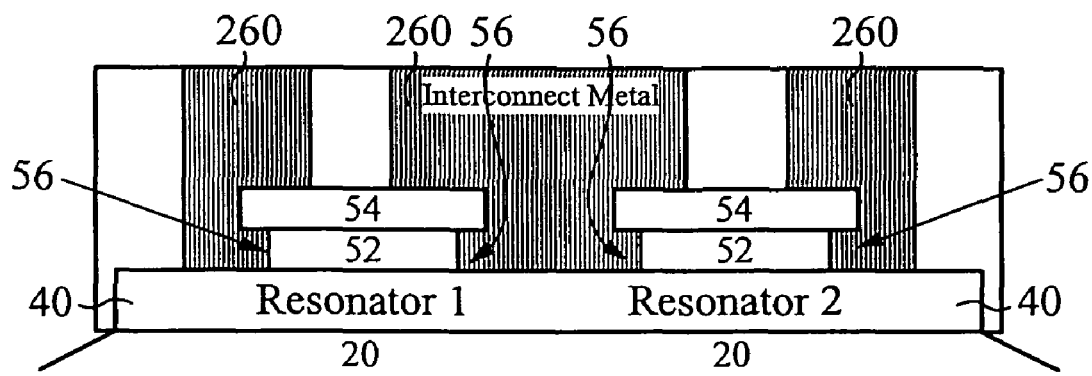
FIG. 13 illustrates an alternative embodiment of the piezoelectric resonator.

An alternative embodiment of the piezoelectric resonator includes a top metal layer of a top electrode patterned and etched to match a bottom metal layer of the top electrode, and an interconnect metal layer patterned to cover the edges of the top electrode. In this manner, the bottom metal layer is protected during etching of the interconnect metal layer. FIG. 13 illustrates the alternative embodiment of the piezoelectric resonator. Resonator 1 and resonator 2 are both fabricated according to the fabrication steps used related to FIGS. 2-5. As such, a portion 56 of each bottom metal layer 52 is removed due to etch undercut during etching of the top metal layers 54. After the top metal layer 54 is etched, the interconnect metal layer 260 is deposited. The interconnect metal layer 260 is then patterned such that all edges of the underlying top electrode, including the top metal layer 54 and the bottom metal layer 52, remain covered by the interconnect metal layer 260 after a subsequent etch step. After patterning, the interconnect metal layer 260 is etched. Since the interconnect metal layer 260 that covers the edges of the top electrode are not etched, etch undercut of the top metal layer 54 is prevented during etching of the interconnect metal layer 260. In this manner the second embodiment of the piezoelectric resonator prevents etch undercutting while etching the interconnect metal layer.

The piezoelectric resonator fabrication methods described above can be optimized to reduce lateral spurious modes in the resonator device without additional processing steps. Spurious modes are reduced by uniquely tailored resonator loading at the resonator perimeter. Examples of such resonator loading techniques are described in U.S. Pat. No. 6,812,619, which is hereby incorporated by reference.

It is understood by those skilled in the art that the terms depositing, patterning, and etching used above are intended as general descriptive terms used in the fabrication processes. The fabrication steps described above can be performed using any conventional fabrication methods capable of depositing, patterning, and etching the layers described.

The piezoelectric resonators are used as reference oscillators, stand-alone filters, and also as building blocks for RF filters. Such RF filters can be used to replace SAW devices. The piezoelectric devices can also be used in all RF stages of products needing filtering, either band filtering, or channel filtering.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A method of fabricating a piezoelectric resonator, the method comprising:
   a. providing a bottom electrode and a piezoelectric layer coupled to the bottom electrode;
   b. depositing a bottom metal layer of a top electrode in direct contact with the piezoelectric layer;
   c. patterning and etching the bottom metal layer;
   d. depositing a top metal layer of the top electrode in direct contact with the etched bottom metal layer;
   e. patterning and etching the top metal layer; and
   f. depositing an interconnect metal layer in direct contact with the etched top metal layer, in direct contact with the etched bottom metal layer, and in direct contact with the piezoelectric layer such that the interconnect metal layer isolates the etched bottom metal layer from subsequent etch steps.

2. The method of claim 1 further comprising patterning and etching the interconnect metal layer such that the bottom metal layer of the top electrode is isolated from the etching.

3. The method of claim 1 wherein the interconnect metal layer is patterned such that all edges of the top electrode including the top metal layer and the bottom metal layer remain covered by the interconnect metal layer after a subsequent etch steps.

4. The method of claim 1 wherein the interconnect metal layer comprises a first interconnect metal layer and a second interconnect metal layer.

5. The method of claim 4 wherein the first interconnect metal layer comprises titanium tungsten.

6. The method of claim 4 wherein the second interconnect metal layer comprises aluminum copper or copper.

7. The method of claim 1 wherein the interconnect metal layer comprises titanium tungsten, tungsten, or molybdenum.

8. The method of claim 1 wherein the interconnect metal layer comprises a metal material that is selectively etched relative to a material of the top metal layer of the top electrode.

9. The method of claim 1 wherein the piezoelectric resonator comprises a bulk acoustic wave resonator.

10. The method of claim 1 wherein the bottom metal layer comprises a refractory metal.

11. The method of claim 10 wherein the bottom metal layer comprises molybdenum.

12. The method of claim 10 wherein the bottom metal layer comprises ruthenium, tungsten, platinum, osmium, rhenium or iridium.

13. The method of claim 1 wherein the top metal layer comprises aluminum, gold, platinum, or an aluminum alloy composition.

14. The method of claim 1 wherein the top metal layer comprises a metal alloy composition.

* * * * *